(12) United States Patent
Anan et al.

(10) Patent No.: US 7,881,358 B2
(45) Date of Patent: Feb. 1, 2011

(54) SURFACE EMITTING LASER

(75) Inventors: Takayoshi Anan, Tokyo (JP); Naofumi Suzuki, Tokyo (JP); Kenichiro Yashiki, Tokyo (JP); Masayoshi Tsuji, Tokyo (JP); Hiroshi Hatakeyama, Tokyo (JP); Kimiyoshi Fukatsu, Tokyo (JP); Takeshi Akagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 35 days.

(21) Appl. No.: 12/518,529

(22) PCT Filed: Dec. 18, 2007

(86) PCT No.: PCT/JP2007/274275

§ 371 (c)(1),
(2), (4) Date: Jun. 10, 2009

(87) PCT Pub. No.: WO2008/078595

PCT Pub. Date: Jul. 3, 2008

(65) Prior Publication Data

US 2010/0020835 A1    Jan. 28, 2010

(30) Foreign Application Priority Data

Dec. 27, 2006  (JP) .............................. 2006-352535

(51) Int. Cl.
*H01S 5/00* (2006.01)
(52) U.S. Cl. ................ 372/50.124; 372/50.1; 372/50.11
(58) Field of Classification Search ................ 372/50.1, 372/50.11, 50.124
See application file for complete search history.

(56) References Cited

FOREIGN PATENT DOCUMENTS

| JP | 1992167484 A | 6/1992 |
|---|---|---|
| JP | 1993211346 A | 8/1993 |
| JP | 1995193325 A | 7/1995 |
| JP | 1996213705 A | 8/1996 |
| JP | 1998256665 A | 9/1998 |
| JP | 2000174329 A | 6/2000 |
| JP | 2002204027 A | 7/2002 |
| JP | 2002353568 A | 12/2002 |
| JP | 2004327992 A | 11/2004 |
| JP | 2005039102 A | 2/2005 |
| JP | 2005535141 A | 11/2005 |

OTHER PUBLICATIONS

International Search Report for PCT/JP2007/074275 mailed Mar. 25, 2008.
D. G. Deppe, et al., "Very-Low-Threshold Index-Confined Planar Microcavity Lasers", IEEE Photonics Technology Letters, vol. 7, No. 9, Sep. 1995, p. 965-967.

*Primary Examiner*—Armando Rodriguez

(57) ABSTRACT

A surface emitting laser is provided with a first multilayer Bragg reflecting mirror including a first layer, a second multilayer Bragg reflecting mirror including a second layer, and an optical resonator unit that is held between these multilayer Bragg reflecting mirrors and includes an active layer. Further, the optical resonator unit contacts with the first layer and second layer respectively. The effective refraction index $n_{eff}$ of the resonator unit is larger than either the first layer or the second layer, and an optical length $n_{eff}L$ of the optical resonator unit has a relationship with an oscillating wavelength $\lambda$ of the surface emitting laser to satisfy the following relationship: $0.5\lambda < n_{eff}L \leq 0.7\lambda$.

8 Claims, 6 Drawing Sheets

SURFACE EMITTING LASER

This application is the National Phase of PCT/JP2007/074275, filed Dec. 18, 2007, which is based upon and claims the benefit of priority from Japanese Patent Application No. 2006-352535 filed on Dec. 27, 2006, the content of which is incorporated by reference.

TECHNICAL FIELD

The present invention relates to a surface emitting laser which is used in light sources and the like for data communications.

BACKGROUND ART

A vertical cavity surface emitting laser (VCSEL) has been widely used as a light source for data communications such as Ethernet (registered trademark) and Fibre Channel due to its low cost and low power consumption properties. These VCSELs have been required to provide such modulation speeds as to support high speed modulation operations at around 10 Gbps (Giga bits per second) in response to an increase in data communication capacity in recent years. Also, the VCSEL is expected as a light source for optical interconnection as well, and devices are increasingly required to support parallelism and ultra-high speeds (20 Gbps/channel).

For modulating the VCSEL at high speeds, it is necessary to increase the relaxation oscillation frequency (fr) and reduce the CR time constant. With respect to the CR time constant, a VCSEL exceeding 20 Gbps can now be fabricated by technologies which involves implantation of ions, embedding of insulating materials, and the like, for reducing the electric resistance of the VCSEL and the electric capacitance around a light emitting region. With respect to fr, on the other hand, fr can be generally increased by increasing the injection current to increase photon density. However, as a current is injected into an active layer, the temperature around a light emitting region of the VCSEL becomes very high as compared with ambient temperature, so that this constitutes one of the significant factors which dictate the upper limit of fr of the VCSEL.

In the VCSEL, a volume in which light exists is reduced to increase fr, such that high photon density can be attained even with the same current. One method therefore is to decrease an oxide aperture diameter in an oxide current confinement structure which has a large optical confinement effect. In this structure, an AlGaAs layer having a high Al composition is oxidized from a mesa side with water vapor to change part of the AlGaAs layer to an insulating material of AlOx.

This structure not only provides a current confinement structure, but also has a large optical confinement effect resulting from the difference in the refraction index between a semiconductor and an insulating material, so that as the oxide aperture diameter is reduced, the area of a portion in which light exists in plane, and the volume of the portion in which light exists, when considering a growth direction as well, are also reduced, to attain high photon density with a small current. Consequently, the VCSEL provides very high current modulation efficiency, so that high fr can be achieved before heat generation caused by current injection can exert a noticeable effect.

While the foregoing technique reduces the volume in which light exists in a VCSEL in-plane direction, the current modulation efficiency at fr can be improved by reducing the volume in which light exists in a growth direction as well, even with the same gain of the active layer.

The structure of the VCSEL in the growth direction comprises an upper and a lower DBR (Distributed Bragg Reflector), and an optical resonator unit sandwiched there between, and a light intensity forms a standing wave in the vertical direction. When the light intensity is designed to be the highest in the active layer, the resulting VCSEL characteristics exhibit a low threshold and a high efficiency. The light intensity in the DBR becomes lower at a site further away from the optical resonator unit, and an "anti-node," which is part of the standing wave that presents a high light intensity, exponentially attenuates. This manner of attenuation depends on the difference in the refraction index between multiple layers which form part of the DBR, and a larger difference in the refraction index results in faster attenuation and stronger confinement of light in the growth direction. Also, in the optical resonator unit, the light intensity exhibits a constant standing wave distribution substantially without attenuation.

In this way, the distribution of light in the growth direction depends on the penetration depth of light into the DBR and on the thickness of the optical resonator unit. For improving the current modulation efficiency at fr, it is effective to reduce the penetration depth of light into the DBR and the thickness of the optical resonator unit as much as possible.

The thickness of the optical resonator unit cannot take an arbitrary value since it must form a standing wave together with the upper and lower DBRs. Generally, an effective optical path length of an optical resonator unit is an integer multiple of $\lambda/2$, where $\lambda$ is the oscillation wavelength of a VCSEL. Accordingly, a structure is provided to minimize the thickness of an optical resonator unit when the optical resonator unit has an effective optical path length equal to $\lambda/2$, and such a small optical resonator is known as a micro-resonator (micro-cavity) structure. The micro-cavity structure has the effect of inhibiting spontaneously emitted light other than the oscillation wavelength, so that the oscillation threshold can be lower to enable a greater reduction of the heat generated by the VCSEL at the same current value.

Techniques related to the structure of this $\lambda/2$ resonator are disclosed in JP-05-211346A, JP-07-193325A, and JP-10-256665A. Also, this technique is disclosed in a document (D. G. Deppe et al., Photonic Technology Letters, 1995, Vol. 7, No. 9, pp. 965-967).

In any of the structures disclosed in these documents, a $\lambda/2$ resonator is sandwiched on both sides by layers which have refraction indexes higher than the effective refraction index of the resonator unit. In this way, the anti-node of a standing wave stands substantially at the center of the resonator unit, and by placing an active layer here, a surface emitting laser can be formed to have a micro-cavity structure, as disclosed by the aforementioned documents. In the following, the surface emitting laser of this structure is referred to as a "$\lambda/2$ micro-cavity surface emitting laser."

Here, a brief description will be given of a $\lambda/2$ micro-cavity surface emitting laser which is an example of a half-wavelength resonator among micro-cavities.

FIG. 1 is a diagram showing a band structure of the structure of a $\lambda/2$ micro-cavity surface emitting laser, and an electric field strength curve. FIG. 1 schematically represents a position in a growth direction (optical axis direction) on the horizontal axis, and band gap energy of each layer on the vertical axis. Assume that the electric field strength means a square of an absolute value of an electric field vector.

Thus, on the electric field strength curve, the "anti-nodes" present maximum values at peak positions of peaks and troughs of a standing wave before the electric field vector is squared, and "nodes" of the standing wave present minimum values. The maximum value as used herein includes the largest value. In the following, the "anti-node" refers to a point of the electric field strength curve at which the curve reaches a local maximum value, and the "node" refers to a point at which the curve reaches a local minimum value.

As shown in FIG. 1, optical resonator unit 212 is sandwiched between first multilayer Bragg reflecting mirror 211 and second multilayer Bragg reflecting mirror 213. In optical resonator unit 212, active layer 2121 is formed within a layer which has a large band gap (corresponding to a low refraction index layer) 2123. First multilayer Bragg reflecting mirror 211 comprises a plurality of laminated pairs of first low refraction index layer 2111 and first high refraction index layer 2112.

Second multilayer Bragg reflecting mirror 213 comprises a plurality of laminated pairs of second low refraction index layer 2132 and second high refraction index layer 2131. First high refraction index layer 2112 and second high refraction index layer 2131 are in contact with optical resonator unit 212. Referring to electric field strength curve 2122 indicative of the electric field strength of optical resonator unit 212, the anti-node of electric field strength curve 2122 is positioned at active layer 212.

DISCLOSURE OF THE INVENTION

However, the $\lambda/2$ micro-cavity surface emitting laser described in the aforementioned document has a problem with respect to current injection. In the $\lambda/2$ micro-cavity surface emitting laser shown in FIG. 1, the effective refraction index of optical resonator unit 212 is lower than those of first high refraction index layer 2112 and second high refraction index layer 2131 on both sides thereof. Generally, there is a correlation between the refraction index and the band gap of semiconductor, where the refraction index tends to be smaller as the band gap is larger. Therefore, a semiconductor which forms the optical resonator unit must be composed of layer (corresponding to a low refraction index layer) 2123 which has a large band gap.

On the other hand, this optical resonator unit 212 must include active layer 2121 inside thereof. This active layer 2121 must have a band gap which is smaller than the band gap of materials which make up the DBR. In other words, while active layer 2121 has a small band gap, low refraction index layer 2123 of optical resonator unit 212 which encloses this active layer 2121 has a large band gap.

In the DBR, doping and graded layers for reducing electric resistance can be applied to a site which presents such a large band gap. However, if they are applied to the optical resonator unit, the device characteristics are degraded because optical absorption increases, and a large electric field is applied to the active layer. For this reason, doping cannot be applied to a layer which has a larger band gap. Accordingly, even if an attempt is made to inject a current into such a structure, low refraction index layer 2123, which corresponds to the large band gap layer, serves as a current block layer, thus making it difficult to inject a current into the active layer.

It is an object of the present invention to provide a surface emitting laser which is capable of achieving a low threshold, a high efficiency, and a high-speed modulation in a micro-cavity structure which includes an optical resonator unit which has an optical path length approximate to $\lambda/2$.

A surface emitting laser of the present invention is a surface emitting laser which comprises a first multilayer Bragg reflecting mirror including a first layer and a first high refraction index layer having a refraction index larger than that of the first layer, a second multilayer Bragg reflecting mirror including a second layer and a second high refraction index layer having a refraction index larger than that of the second layer, and an optical resonator unit sandwiched by the first and second multilayer Bragg reflecting mirrors and including an active layer for generating an optical gain, wherein with respect to the first multilayer Bragg reflecting mirror, the first layer is in contact with the optical resonator unit, and with respect to the second multilayer Bragg reflecting mirror, the second layer is in contact with the optical resonator unit, the resonator unit exhibits effective refraction index $n_{eff}$ which is larger than those of the first and second layers, and the optical resonator unit has optical path length $n_{eff}L$ which is in a relationship of $0.5\lambda < n_{eff}L \leq 0.7\lambda$ with oscillation wavelength $\lambda$ of the surface emitting laser, and the active layer is situated at a position spaced away by $\Delta L$ from the boundary of the optical resonator unit with the first multilayer Bragg reflecting mirror or the second multilayer Bragg reflecting mirror, where $\Delta L$ is a value resulting from the subtraction of $0.5\lambda$ from the optical path length $n_{eff}L$.

According to the present invention, light intensity can be increased in an active layer in a micro-cavity structure which includes an optical resonator unit having an optical path length close to $\lambda/2$, thus attaining low-threshold, highly efficient device characteristics. Also, current can be readily injected into the active layer to increase the injection current, increase the relaxation oscillation frequency, and improve high-speed modulation performance.

Figure 1:
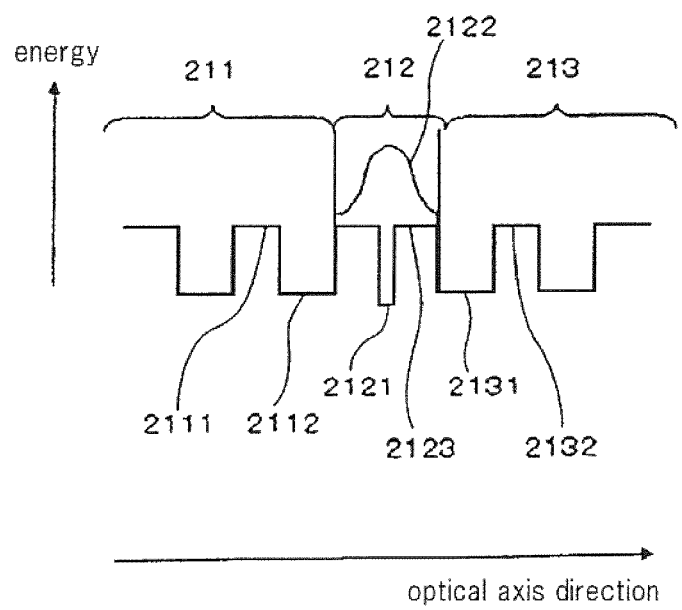
FIG. 1 is a diagram showing a band structure and an electric field strength curve of an associated half-wavelength resonator (related art).

DESCRIPTION OF REFERENCE NUMERALS 11, 211, 221, 31, 41 First Multilayer Bragg Reflecting mirrors
111, 2112, 311, 411 First High Refraction Index Layers
112, 113, 2111, 312, 313, 412, 413 First Low Refraction Index Layers
12, 212, 222, 32, 42 Optical resonator Unit
121, 2121, 321, 421 Active layer
122, 2122, 2222, 322, 422 Electric Field Strength Curves
123, 323, 423 High Refraction Index Layers
13, 213, 33, 43 Second Multilayer Bragg Reflecting mirrors
131, 2132, 331, 431 Second Low Refraction Index Layers
132, 2131, 332, 432 Second High Refraction Index Layers
2123 Layer Having a Large Band Gap (Low Refraction Index Layer)
50 N-type GaAs substrate
51, 61, 71, 81, 91 First Multilayer Bragg Reflecting mirrors
511 Si Doped GaAs Layer
512 Si Doped $Al_{0.9}Ga_{0.1}As$ layer
513 N-type $Al_{0.9}Ga_{0.1}As$ layer
514 Si Doped AlGaAs Graded Layer
52, 62, 72, 82, 92 Optical resonator Unit
521, 621, 721, 821, 921 Ternary Quantum Active Layers
522 P-type $Al_{0.3}Ga_{0.7}As$ Electron Block Layer
523, 623, 723 Tunnel Junctions
524 Si Doped GaAs Layer
53, 63, 73, 83, 93 Second Multilayer Bragg Reflecting mirrors
531, 631, 731, 831 $SiO_2$ Layers
532, 632, 732, 832 Amorphous Si Layers
54, 55 Electrodes
611 N-type GaAs Layer
612 N-type AlGaAs Layer
613 N-type AlGaAs Layer
614 Si Doped $Al_{0.98}Ga_{0.02}As$ Layer (Current Confinement Layer)
622 P-type AlGaAs Electron Block Layer
624, 715, 724, 822 N-type GaAs Contact Layers
711 GaAs Layer
712 AlOx Oxidized Low Refraction Index Layer
713 N-type $Al_{0.9}Ga_{0.1}As$ Layer
714, 913 N-Type AlGaAs Graded Layers
722 P-type AlGaAs Electron Block Layer
811 P-type GaAs High Refraction Index Layer
812 P-type AlGaAs Low Refraction Index Layer
813 P-type AlGaAs Low Refraction Index Layer
814 C Doped $Al_{0.98}Ga_{0.02}As$ Layer (Oxide Confinement Layer)
815 P-type AlGaAs Graded Layer
911 N-type GaAs High Refraction Index Layer
912 N-type AlGaAs Low Refraction Index Layer
931 P-type AlGaAs Low Refraction Index Layer
932 P-type GaAs High Refraction Index Layer
933 P-type AlGaAs Oxide Confinement Layer (Current Confinement Layer)

BEST MODE FOR CARRYING OUT THE INVENTION

Next, an embodiment of the present invention will be described in detail with reference to the drawings.

Figure 2:
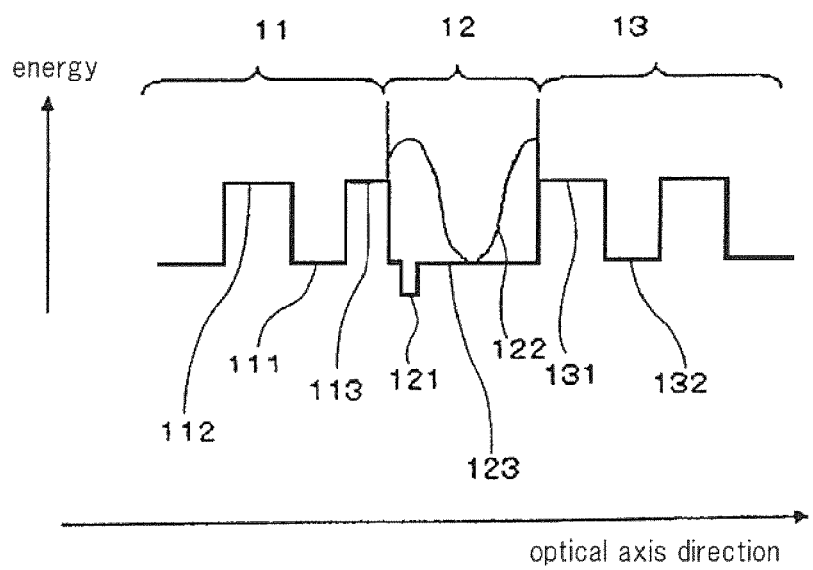
FIG. 2 is a diagram showing a band structure and an electric field strength curve of a surface emitting laser according to an embodiment.

A description will be given of the configuration of a surface emitting laser of this embodiment. FIG. 2 is a diagram showing a band structure and an electric field strength curve of the surface emitting laser of this embodiment. FIG. 2 schematically represents the position in a growth direction (optical axis direction) on the horizontal axis, and band gap energy of each layer on the vertical axis.

A curve designated by reference number 122 in FIG. 2 indicates an electric field strength distribution formed within a VCSEL. The electric field strength distribution refers to a distribution of a squared electric field vector of a standing wave. The surface emitting laser of this embodiment comprises first multilayer Bragg reflecting mirror 11, second multilayer Bragg reflecting mirror 13, and an optical resonator unit 12 sandwiched between these reflecting mirrors.

First multilayer Bragg reflecting mirror 11 comprises alternating multiple layers which have λ/4 thicknesses of first low refraction index layer 112 and first high refraction index layer 111, respectively, where λ is the oscillation wavelength of the surface emitting laser. Second multilayer Bragg reflecting mirror 13 comprises alternating multiple layers which have λ/4 thicknesses of second low refraction index layer 131 and second high reflection index layer 132, respectively. Optical resonator unit 12 is configured to include therein active layer 121 for generating an optical gain.

Also, the surface emitting laser of this embodiment is structured such that optical resonator unit 12 is sandwiched on both sides by first low refraction index layer 113 and second low reflection index layer 131, and effective refraction index $n_{eff}$ of optical resonator unit 12 is larger than those of first low refraction index layer 113 and second low refraction index layer 131. Further, optical resonator unit 12 has optical path length $n_{eff}L$ which is in the range of $0.5\lambda < n_{eff}L \leq 0.7\lambda$, where L designates the thickness of the optical resonator. Optical path length $n_{eff}L$ is slightly larger than one-half wavelength, and active layer 121 is formed near an anti-node of electric field strength curve 122.

When ΔL represents a value resulting from the subtraction of 0.5λ from optical path length $n_{eff}L$, if active layer 121 is placed at a position spaced by ΔL from the boundary of first multilayer Bragg reflecting mirror 11 or second multilayer Bragg reflecting mirror 13 and optical resonator unit 12, the position of active layer 121 coincides with the site of the anti-node of electric field strength curve 122. Since FIG. 2 is shown on the assumption that first multilayer Bragg reflecting mirror 11 has n-type conductivity, active layer 121 is placed at a site closer to first multilayer Bragg reflecting mirror 11.

Next, a description will be given of the principle of operation of the surface emitting laser in the configuration described above.

One means for increasing the relaxation oscillation frequency of VCSEL involves a method of reducing the effective optical volume to increase photon density by reducing the extent of light intensity in the optical axis direction. The extent of light in the optical axis direction is measured by adding a penetration depth of light into upper and lower DBRs and the optical path length of the optical resonator.

In this embodiment, the optical path length of the optical resonator is chosen to be approximately a half-wavelength cavity, which is a minimum value, in order to reduce the extent of light intensity in the optical axis direction. As described in the paragraph of Problem, the associated half-wavelength cavity (micro-cavity) structure suffers from a problem in which current injection is hindered. To solve this problem, in the surface emitting laser of this embodiment, the optical resonator unit is given a large effective refraction index, and the optical resonator unit is sandwiched on both sides by low refraction index layers.

Figure 3:
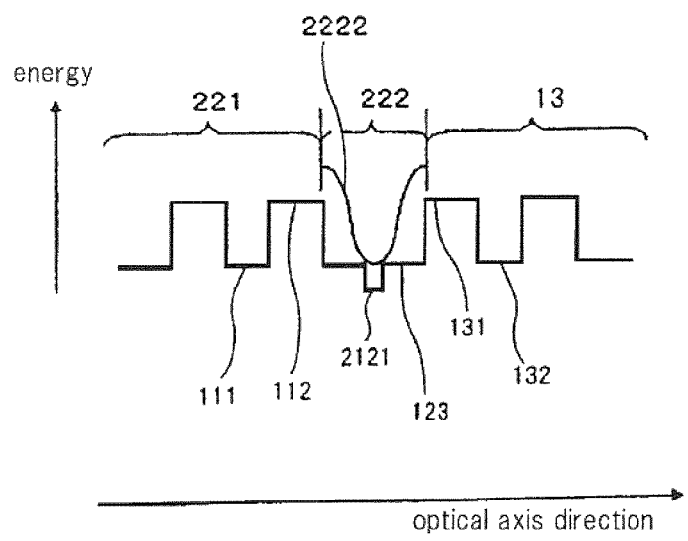
FIG. 3 is a diagram showing a band structure and an electric field strength curve, resulting from a half-wavelength resonator with an active layer position at the center of the resonator.

FIG. 3 is a diagram showing a band structure and the electric field strength curve resulting from a half-wavelength resonator with an active layer position at the center of the resonator.

As shown in FIG. 3, the surface emitting laser comprises first multilayer Bragg reflecting mirror 221, second multilayer Bragg reflecting mirror 13, and optical resonator unit 222 sandwiched there between. Active layer 2121 of optical resonator unit 222 is sandwiched by layer 123 which has a similar band gap to active layer 2121 (corresponding to a high refraction index layer).

In such a structure, surround active layer 2121 can be surrounded by layer 123 having a relatively small band gap which is similar to that of the active layer, thus facilitating the current injection into active layer 2121.

However, in the structure shown in FIG. 3, since optical resonator unit 222 is centered near a node of electric field strength curve 2222, good VCSEL characteristics cannot be attained if active layer 2121 is placed at the center of the optical resonator. This is because the gain of the active layer is not effectively amplified by the resonator. Also, in the VCSEL structure as shown in FIG. 3, anti-nodes of electric field strength curve 2222 coincide with the boundaries of optical resonator unit 222 with DBRs 221, 13, respectively, causing the position of the active layer to be spaced far away from the position of the anti-node of electric field strength curve 2222.

Accordingly, in this embodiment, the basic structure shown in FIG. 2 is developed in such a manner that the optical path length $n_{\textit{eff}}L$ of optical resonator unit 12 is set in the range of $0.5\lambda < n_{\textit{eff}}L \leq 0.7\lambda$, slightly longer than one-half wavelength, such that active layer 121 can be placed at the position of the anti-node of electric field strength curve 122. On the other hand, if the optical path length of optical resonator unit 12 is set longer than $0.7\lambda$, the resonance peak wavelength of the VCSEL becomes longer which results in a larger difference between the resonance peak wavelength and a wavelength at which the DBR exhibits a maximum reflectivity, thus causing the characteristics to be degraded as the VCSEL.

In this regard, since the optical path length of optical resonator unit 12 is set slightly longer than $\lambda/2$, the optical path length of first low refraction index layer 113 included in DBR 11 and in contact with optical resonator unit 12 becomes shorter because of an increase in the optical path length of optical resonator unit 12, and is shorter than $\lambda/4$.

The anti-node of electric field strength curve 122 is situated inside of optical resonator unit 12 from the boundary of first multilayer Bragg reflecting mirror 11 by $\Delta L$ ($=n_{\textit{eff}}L-0.5\lambda$) by which optical path length $n_{\textit{eff}}L$ is increased. Active layer 121 is placed at this position. FIG. 2 shows the case where first multilayer Bragg reflecting mirror 11 has n-type conductivity. For this reason, active layer 121 is placed at a position spaced by $\Delta L$ from the boundary of first multilayer Bragg reflecting mirror 11. However, if second multilayer Bragg reflecting mirror 13 has the n-type conductivity, active layer 121 is placed at a position spaced by $\Delta L$ from the boundary of second multilayer Bragg reflecting mirror 13. The active layer is placed at a site closer to the n-type DBR because electrons are more prone to go beyond the potential barrier as compared with holes, and the active layer is placed on the side closer to an electron source.

With the employment of such a structure, a surface emitting laser is realized to have a micro-cavity structure which facilitates the current injection.

In the surface emitting laser of this embodiment, the optical resonator unit has a larger effective refraction index $n_{\textit{eff}}$ than the refraction indexes of the first layer and second layer which sandwich the optical resonator unit, so that the band gap is smaller than the surroundings. When the optical path length of such an optical resonator unit is set to $0.5\lambda$, an anti-node of the electric field strength is situated on the boundary of each of the first layer and second layer with the optical resonator unit. In this embodiment, the optical path length $n_{\textit{eff}}L$ of the optical resonator unit is set longer by $\Delta L$ ($0<\Delta L \leq 0.2\lambda$) than $0.5\lambda$, such that the position of the anti-node of the electric field strength is spaced away by $\Delta L$ from the boundary with the multilayer Bragg reflecting mirror, and the active layer is placed at that position. Consequently, the gain of the active layer can be effectively amplified by the resonator, resulting in low-threshold, highly efficient device characteristics. Also, since the active layer is sandwiched by layers of small band gaps, the current injection can be readily achieved in a micro-cavity structure as well. As a result, the relaxation oscillation frequency is increased, and high-speed modulation characteristics are improved.

Also, since optical resonator unit 12 can be comprised of layers which have relatively small band gaps, a good tunnel junction structure can be introduced with the ability to feed a sufficient tunnel current at a low voltage into a node of the electric field strength which is situated substantially at the center of this optical resonator unit 12. This is because the tunnel current has the nature of exponentially increasing as the band gap becomes smaller. The tunnel junction structure can convert the carrier of the current from holes to electrons, so that electrodes for introducing the current can be both chosen to be n-type electrodes. In this way, even if DBR 13 is formed of non-conductive materials such as multiple dielectric layers and the like, a VCSEL can be attained to have good current-voltage characteristics.

Further, since the tunnel junction having low-resistance n-type electrodes employed for both the electrodes for the current injection can be placed near the active layer, the resistance of the device can be reduced, making it possible to draw out a low-threshold characteristic, a high-speed modulation characteristic and the like, which are essential characteristics of the micro-cavity structure. Accordingly, the surface emitting laser of this embodiment can be employed as a light source for optical interconnection which particularly requires low power consumption, high-speed modulation characteristic and the like.

In the following, specific VCSEL structures will be described with reference to examples. In each example, L designates the thickness of the optical resonator, and $\lambda$ the oscillation wavelength of the surface emitting laser.

Example 1

Figure 4A:
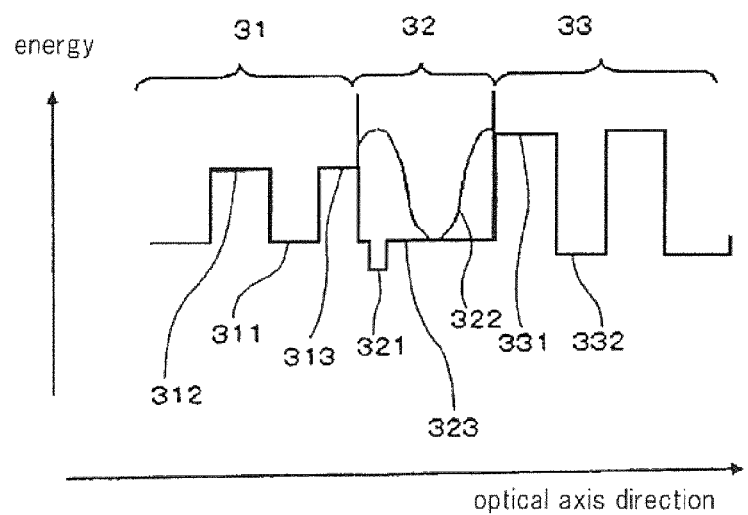
FIG. 4A is a diagram showing a band structure and an electric field strength curve of a surface emitting laser according to Example 1.

FIG. 4A is a diagram showing a band structure and an electric field strength curve of a surface emitting laser according to this Example. The configuration of the surface emitting laser of this Example will be described with reference to FIG. 4A.

The surface emitting laser of this Example comprises first multilayer Bragg reflecting mirror 31 comprised of a semiconductor material, second multilayer Bragg reflecting mirror 33 comprised of a dielectric material, and optical resonator unit 32 sandwiched by these DBRs. First multilayer Bragg reflecting mirror 31 corresponds to a semiconductor DBR. Second multilayer Bragg reflecting mirror 33 corresponds to a dielectric DBR.

First multilayer Bragg reflecting mirror 31 comprises alternating multiple layers of first low refraction index layer 312 and first high refraction index layer 311, each of which has a thickness of $\lambda/4$. Second multilayer Bragg reflecting mirror 33 comprises alternating multiple layers of second low refraction index layer 331 and second high refraction index layer 332, each of which has a thickness of λ/4. Optical resonator unit 32 is configured to include therein active layer 321 for generating an optical gain.

Also, optical resonator unit 32 is sandwiched on both sides by first low refraction index layer 313 and second low refraction index layer 331. Active layer 321 is sandwiched by layer 323 which has a band gap similar to that of active layer 321 (corresponding to a high refraction index layer). Accordingly, effective refraction index $n_{eff}$ of the resonator unit is larger than those of first low refraction index layer 313 and second low refraction index layer 331.

Further, optical path length $n_{eff}L$ of optical resonator unit 32 is set in the range of $0.5\lambda < n_{eff}L \leq 0.7\lambda$, i.e., larger than one-half wavelength, and active layer 321 is formed at a position corresponding to an anti-node of electric field strength curve 322.

Figure 4B:
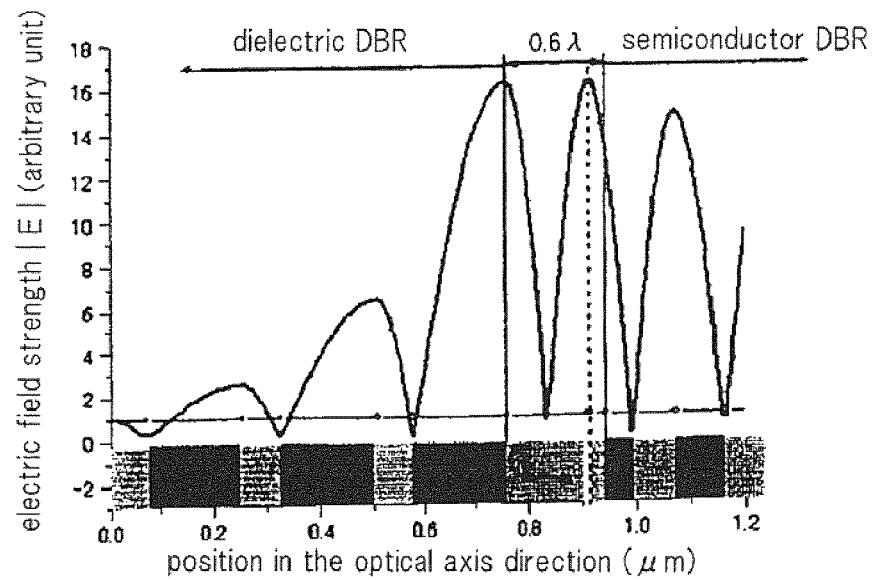
FIG. 4B is a diagram showing the result of calculating an absolute value of electric field for the surface emitting laser of Example 1.

FIG. 4B shows the result of calculating an absolute value of an electric field strength of the VCSEL shown in FIG. 4A. In FIG. 4B, the horizontal axis represents the position in the optical axis direction, and the vertical axis represents the electric field strength.

For the calculation, the optical path length of optical resonator unit 32 was set to 0.6λ, an AlAs layer was used for first low refraction index layer 312 of semiconductor DBR 31, and a GaAs layer was used for first high refraction index layer 311. Also, a $SiO_2$ layer was used for second low refraction index layer 331 of dielectric DBR 33, and an amorphous Si layer was used for second high refraction index layer 332. Assuming that the $SiO_2$ layer/amorphous Si layer forms a pair, dielectric DBR 33 was formed of three pairs; and the semiconductor DBR, 20 pairs. A designed wavelength of the DBR was chosen to be 1070 nm.

A resonance peak wavelength of this VCSEL structure is calculated to be 1075 nm which differs merely by 5 nm from the designed wavelength of the DBR, i.e., 1070 nm, and the reflectivity of the DBR is sufficiently high in this wavelength range. Also, active layer 321 substantially coincides with the position of the anti-node of the electric field strength, and exhibits a sufficiently large strength. When this VCSEL is irradiated with excitation light while the light intensity is changed, a good VCSEL oscillation is attained with a low excitation light intensity.

Now, a description will be given of a surface emitting laser, where an optical resonator unit designed to have an optical path length of 0.5λ, and DBRs overlying and underlying the optical resonator unit are adjusted in thickness to align an active layer to the position of an anti-node of an electric field strength. The resulting surface emitting laser is designated as a comparative example for comparison with the surface emitting laser of this embodiment.

Figure 5A:
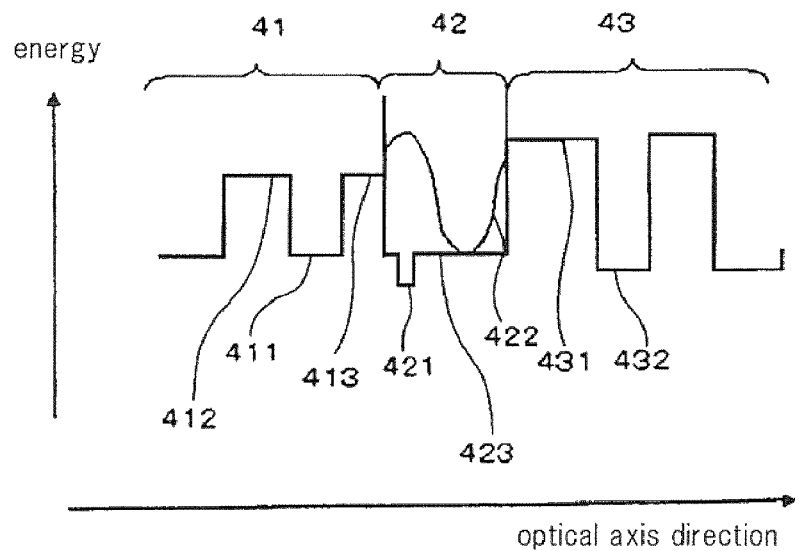
FIG. 5A is a diagram showing a band structure and an electric field strength curve of a surface emitting laser which is a comparative example of the surface emitting laser of Example 1.

FIG. 5A is a diagram showing a band structure and the electric field strength curve of the surface emitting laser of the comparative example.

As shown in FIG. 5A, the surface emitting laser of the comparative example comprises first multilayer Bragg reflecting mirror 41 comprised of a semiconductor material, second multilayer Bragg reflecting mirror 43 comprised of a dielectric material, and optical resonator unit 42 sandwiched by these DBRs. First multilayer Bragg reflecting mirror 41 corresponds to a semiconductor DBR, and second multilayer Bragg reflecting mirror 43 corresponds to a dielectric DBR.

First multilayer Bragg reflecting mirror 41 comprises alternating multiple layers of first low refraction index layer 412 and first high refraction index layer 411, each of which has a thickness of λ/4. Second multilayer Bragg reflecting mirror 43 comprises alternating multiple layers of second low refraction index layer 431 and second high refraction index layer 432, each having a thickness of λ/4. Optical resonator unit 42 is configured to include therein active layer 421 for generating an optical gain.

Then, in the comparative example shown in FIG. 5A, the optical resonator is designed to have an optical path length of 0.5λ. Active layer 421 is sandwiched by layer 423 which has a band gap similar to that of active layer 421 (corresponding to a high refraction index layer). Also, with respect to the optical path lengths of the upper and lower DBRs, second low refraction index layer 431 included in dielectric DBR 43 is made longer than λ/4, while first low refraction index layer 413 included in semiconductor DBR 41 is made shorter than λ/4, to shift the positions of the anti-node and node of the electric field strength, as shown by electric field strength curve 422.

Figure 5B:
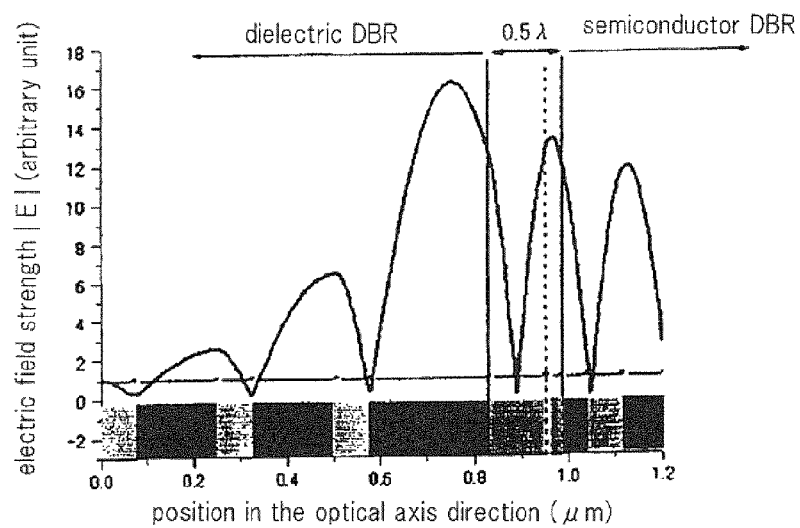
FIG. 5B is a diagram showing the result of calculating an absolute value of electric field for the surface emitting laser which is the comparative example of the surface emitting laser of Example 1.

FIG. 5B is a diagram showing the result of calculating the absolute value of the electric field strength in the VCSEL which has the structure of FIG. 5A. In this structure, the resonance peak wavelength is calculated to be 1052 nm, which is shorter by 18 nm than the designed wavelength of the DBR, i.e., 1070 nm and largely deviates from the peak reflectivity wavelength from the DBR. It can also be seen that active layer 421 is offset from the position of an anti-node of the electric field strength and is degraded in strength as well.

As can be seen from the result of the comparative example, it is apparent that in a structure which simply adjusts the thicknesses of the upper and lower DBRs to spatially shift them in order to align the active layer to the position of the anti-node of the electric field strength, disturbance arises in a manner of growing the standing wave between the DBR and optical resonator unit. Such a phenomenon is particularly marked when the dielectric/semiconductor interface which presents a large refraction index difference is not precisely situated at the anti-node of the standing wave.

When one DBR is comprised of a dielectric material, like this Example, it is important to choose the optical path length of the optical resonator to be longer than 0.5λ, and to place the active layer at the position of the anti-node of the standing wave.

Example 2

Figure 6A:
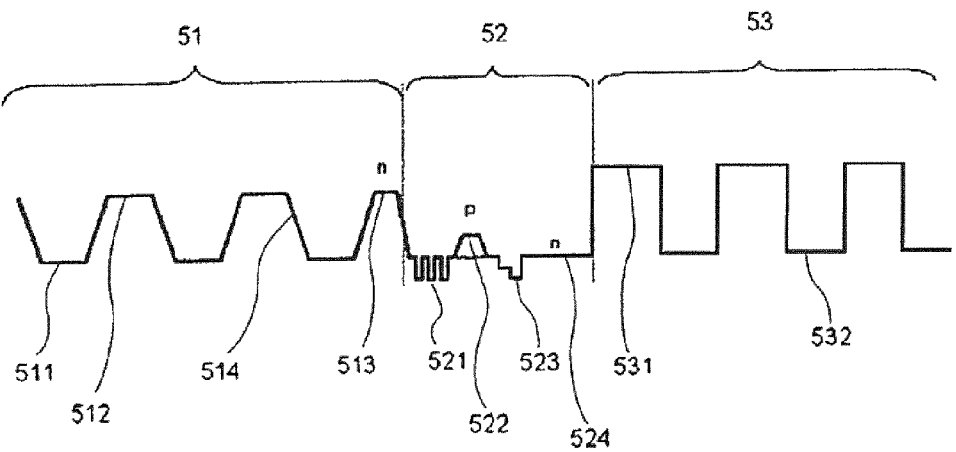
FIG. 6A is a diagram showing a band structure of a surface emitting laser according to Example 2.
Figure 6B:
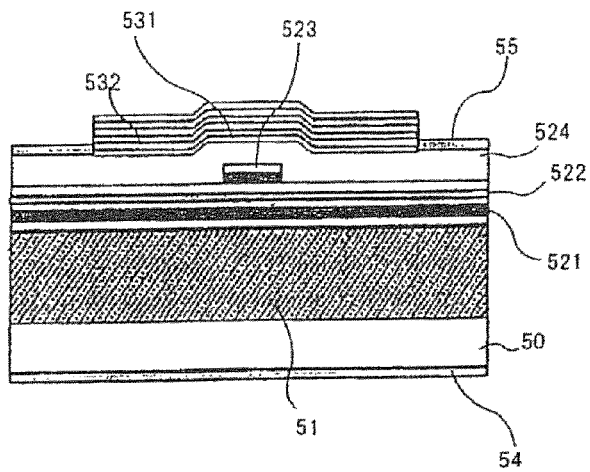
FIG. 6B is a diagram showing the cross-sectional structure of the surface emitting laser of Example 2.

In this Example, a description will be given of an exemplary configuration of a current injection type VCSEL structure. FIG. 6A is a schematic diagram showing a band structure of a surface emitting laser according to this Example, and FIG. 6B is a schematic diagram showing a cross-section of the device structure. While FIG. 6A does not show the vertical axis or horizontal axis, the vertical axis and horizontal axis are similar to those in FIG. 2.

As shown in FIG. 6A, the surface emitting laser of this Example comprises first multilayer Bragg reflecting mirror 51, second multilayer Bragg reflecting mirror 53, and optical resonator unit 52 sandwiched by these DBRs. First multilayer Bragg reflecting mirror 51 corresponds to an n-type DBR layer, and second multilayer Bragg reflecting mirror 53 corresponds to a dielectric DBR.

N-type DBR layer 51 includes a plurality of pairs, each of which constitutes a basic unit and is a combination of Si doped GaAs layer 511 which is a high refraction index layer and Si doped $Al_{0.9}Ga_{0.1}As$ layer 512 which is a low refraction index layer. These layers are all doped with Si in a concentration of $2 \times 10^{18}$ $cm^{-3}$.

Si doped AlGaAs graded layer 514 is disposed between the low refraction index layer and high refraction index layer to reduce electric resistance. Dielectric DBR 53 includes a plurality of pairs of $SiO_2$ layer 531/amorphous Si layer 532. Optical resonator unit 52 comprises a lamination of ternary quantum well active layer 521, carbon (C) doped p-type $Al_{0.3}Ga_{0.7}As$ electron block layer 522, tunnel junction 523, and Si doped GaAs layer 524. In the following, the ternary quantum well active layer is simply referred to as the "active layer." Since optical path length $n_{eff}L$ of optical resonator unit 52 and the placement of active layer 521 are similar to those in Example 1, detailed descriptions thereon are omitted.

Next, a description will be given of a method of manufacturing the surface emitting laser of this Example.

Si doped GaAs layer 511 which is a high refraction index layer and Si doped $Al_{0.9}Ga_{0.1}As$ layer 512 which is a low refraction index layer are paired to define a basic unit, and n-type DBR layer 51 having 35.5 pairs is formed on n-type GaAs substrate 50 by a metal-organic chemical vapor deposition (MOCVD) method. N-type GaAs substrate 50 is a substrate doped with Si in a concentration of $2 \times 10^{18}$ cm$^{-3}$. A molecular beam epitaxy (MBE) method may be employed instead of the MOCVD method.

Si doped AlGaAs graded layer 514 is formed between the low refraction index layer and high refraction index layer to reduce electric resistance. Each of the layers which form part of n-type DBR layer 51 is formed such that the thickness of each layer is a so-called $\lambda/4$ multilayer reflective film. Last n-type $Al_{0.9}Ga_{0.1}As$ layer 513 of n-type DBR layer 51 is reduced in thickness by the optical path length of $0.1\lambda$.

In a step of manufacturing optical resonator unit 52, ternary quantum well active layer (hereinafter referred to as the active layer) 521 comprised of an undoped $In_{0.3}Ga_{0.7}As$ well layer of 5 nm thick and an undoped GaAs barrier layer of 10 nm thick is grown on n-type DBR layer 51. Subsequently, carbon (C) doped p-type $Al_{0.3}Ga_{0.7}As$ electron block layer 522 of 30 nm thick and a tunnel junction layer comprised of high-concentration C doped GaAsSb and high concentration Si doped InGaAs are laminated as a tunnel junction layer.

Here, the grown wafer is once extracted from a growth furnace, a circular mesa type mask resist is formed on the tunnel junction layer, and tunnel junction 523 is etched from above the mask resist to pattern the same. As a result of this step, since a reverse bias of the pn junction is applied to regions except for tunnel junction 523 to block a current while current is flowing through the device, a current flows into only the eventually remaining tunnel junction 523, thus realizing a current confinement structure.

Subsequently, part of an active layer region is implanted with oxygen ions to increase the resistance thereof, and the wafer is again introduced into the growth furnace after the mask resist is removed, and Si doped GaAs layer 524 is grown to form optical resonator unit 52. Final Si doped GaAs layer 524 that is 30 nm thick is a contact layer.

Here, the thickness of a spacer is designed such that tunnel junction 523 is formed at a position coincident with a node of the electric field strength of optical resonator unit 52. In this way, it is possible to minimize optical absorption due to high-concentration doping. Also, active layer 521 is designed to be formed at a position coincident with the anti-node of the electric field strength, and the optical path length of optical resonator unit 52 is chosen to be $0.6\lambda$ in this Example.

Subsequently, the wafer is extracted from the growth furnace, and dielectric DBR 53 is formed of three pairs of laminated $SiO_2$ layer 531/amorphous Si layer 532.

The laminate structure formed in the foregoing manner is processed into a surface emitting laser device in a device process step. First, part of dielectric DBR 53 is removed by etching to expose Si doped GaAs layer 524. There, n-type electrode 55 made of an AuGe alloy is formed as an electrode. Also, n-type electrode 54 made of an AuGe alloy is formed on the back of n-type GaAs substrate 50.

This VCSEL device is applied with a voltage to cause a current to flow therethrough, and the laser begins to oscillate when the current value exceeds a threshold current. The voltage is applied between electrode 54 and electrode 55, such that the voltage at electrode 55 is higher than that at electrode 54. In this way, pn-reverse bias is applied, except for tunnel junction 523, to expand a depletion layer, thus blocking the current. In tunnel junction 523, a current flows through application of a reverse bias, so that holes are introduced from the p-type GaAsSb layer or p-type AlGaAs layer to active layer 521.

A device employing this VCSEL with a current confinement diameter of 5 μm exhibits good static characteristics with an oscillation threshold current of 0.5 mA and a differential resistance of 80Ω. According to this Example, since a semiconductor layer having a small band gap can be placed around the active layer, the problem of hindered current injection is solved. Also, since the tunnel junction can also be placed near the active layer, the resistance of the device can be reduced.

Further, from a small signal modulation experiment, relaxation oscillation frequency fr of this device is approximately 26 GHz which largely exceeds 20 GHz of an oxide confined type VCSEL with an associated $\lambda$-cavity.

The reason for the above may be considered in the following manner. The oxide confined type $\lambda$-cavity VCSEL has an effective cavity length of approximately 1.24 μm in the growth direction, whereas the device of this Example has an effective cavity length of 0.705 μm which is small as compared with that of the associated $\lambda$-cavity VCSEL. As a result, presumably, the current modulation efficiency at fr increases approximately 1.33 times higher than that of the associated $\lambda$-cavity VCSEL, allowing the upper limit of relaxation oscillation frequency fr to extend.

In particular, in this VCSEL structure, since dielectric DBR 53 is used for the upper DBR, a optical penetration depth is as small as 0.054 μm in this portion. For this reason, the overall effective cavity length is more affected when the optical path length of the optical resonator unit is reduced to approximately one-half from the $\lambda$-cavity.

While the n-side electrode is taken from the back of the substrate in this Example, etching can be performed from part of the surface up to n-type DBR layer 51 to take the n-side electrode from the exposed surface of the substrate.

Example 3

While the current confinement is achieved by tunnel junction 523 in Example 2, an oxide current confinement structure is disposed in part of an n-type semiconductor DBR in this Example.

Figure 7:
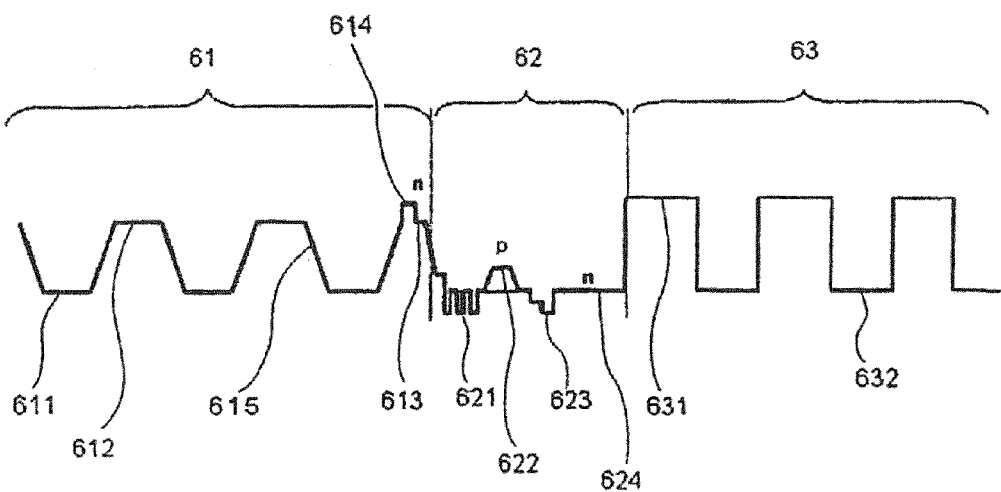
FIG. 7 is a schematic diagram showing a band structure of a surface emitting laser according to Example 3.

FIG. 7 is a schematic diagram showing a band structure of a surface emitting laser according to this Example. While FIG. 7 does not show the vertical axis or horizontal axis, the vertical axis and horizontal axis are similar to those in FIG. 2.

As shown in FIG. 7, the surface emitting laser of this Example comprises first multilayer Bragg reflecting mirror 61, second multilayer Bragg reflecting mirror 63, and optical resonator unit 62 sandwiched between these DBRs. First multilayer Bragg reflecting mirror 61 corresponds to a lower n-type DBR layer, while second multilayer Bragg reflecting mirror 63 corresponds to an upper dielectric DBR layer.

Lower n-type DBR layer 61 includes a plurality of pairs, each of which constitutes a basic unit and is a combination of GaAs layer 611 which is a high refraction index layer and AlGaAs layer 612 which is a low refraction index layer. Si doped AlGaAs graded layer 615 is disposed between the low refraction index layer and high refraction index layer to reduce electric resistance. Also, n-type AlGaAs layer 613, which is a low refraction index layer, partially includes Si doped $Al_{0.98}Ga_{0.02}As$ layer 614, which serves as a current confinement layer, near optical resonator unit 62.

Upper dielectric DBR layer 63 includes a plurality of pairs of $SiO_2$ layer 631/amorphous Si layer 632. Optical resonator unit 62 comprises a laminate of ternary quantum well active layer (hereinafter simply referred to as the "active layer") 621, p-type AlGaAs electron block layer 622, tunnel junction 623, and n-type GaAs contact layer 624.

In this regard, since upper dielectric DBR layer 63 and optical resonator unit 62 are similar to components corresponding to the respective ones in Example 2, detailed descriptions thereon are omitted.

As described above, in this Example, Si doped $Al_{0.98}Ga_{0.02}As$ layer (hereinafter simply referred to as the "current confinement layer") 614 is formed in part of lower n-type DBR layer 61, to serve as a current confinement layer. Also, since this structure relies on electron-based n-type current confinement, a high-mobility GaAs layer is laminated between current confinement layer 614 and active layer 621 as little as possible.

It is known that the mobility of electrons is as low as that of holes when the Al composition of AlGaAs is 0.35 or more, and a sufficient current confinement effect can be provided by using AlGaAs in such a composition. Also, the material is not limited to AlGaAs, but any material can be used as long as it has a low mobility, and a diluted N-type semiconductor or the like may be used. Examples of dilute N-type semiconductor include GaAsN, InGaPN, AlGaAsN, and GaAsPN.

Also, since the current confinement is performed in an oxidized layer area of AlGaAs, tunnel junction 623 need not be patterned. Since a process step for manufacturing a device is similar to an associated oxide confined type surface emitting laser device, a detailed description is omitted here, and a brief description will be given of a step of forming an oxide confinement structure.

The oxide confinement structure is formed into a mesa structure of approximately 30 μm in diameter by selective etching until topmost n-type GaAs layer 611 is exposed among the high refraction index layers of lower n-type DBR layer 61. This step exposes the side surface of $Al_{0.98}Ga_{0.02}As$ current confinement layer. Then, the oxide confinement structure is heated at a temperature of approximately 400 degrees for approximately ten minutes in a furnace in a vapor atmosphere. Since the Al-composition of the current confinement layer is as large as 0.98, and differs from the Al-composition of 0.9 in low refraction index AlGaAs layer 612 within lower n-type DBR layer 61, the oxidization speed is high, and oxidization selectively progresses in current confinement layer 614. In this way, a toroidal current block structure is formed with a current pass layer of approximately 6 μm in diameter being formed in a central region thereof.

While this Example differs from Example 2 in that the in-plane optical confinement is performed by an oxide layer, the effective resonator length is the same in the growth direction, and accordingly, the high-speed modulation characteristic is similar to that of Example 2.

Example 4

In this Example, part of the lower n-type DBR layer in Example 2 is replaced with a DBR comprised of multiple layers of semiconductor/insulating material.

Figure 8:
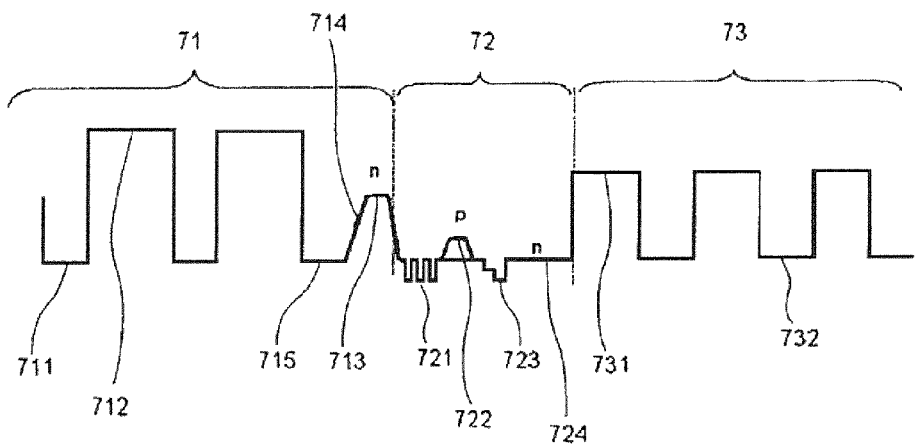
FIG. 8 is a schematic diagram showing a band structure of a surface emitting laser according to Example 4.

FIG. 8 is a schematic diagram showing a band structure of a surface emitting laser according to this Example. While FIG. 8 does not show the vertical axis or horizontal axis, the vertical axis and horizontal axis are similar to those in FIG. 2.

As shown in FIG. 8, the surface emitting laser of this Example comprises first multilayer Bragg reflecting mirror 71, second multilayer Bragg reflecting mirror 73, and optical resonator unit 72 sandwiched between these DBRs. First multilayer Bragg reflecting mirror 71 corresponds to a lower n-type DBR layer, and second multilayer Bragg reflecting mirror 73 corresponds to an upper n-type DBR layer.

Lower n-type DBR layer 71 comprises a plurality of pairs, each of which constitutes a basic unit and is a combination of GaAs layer 711 which is a high refraction index layer and AlOx oxide low refraction index layer 712. AlOx oxide low refraction index layer 712 is an oxidized $Al_{0.98}Ga_{0.02}As$ layer in this Example. Also, n-type GaAs contact layer 715, n-type AlGaAs graded layer 714, and low-refraction index n-type $Al_{0.9}Ga_{0.1}As$ layer 713 are formed in order in topmost AlOx oxide low refraction index layer 712, close to optical resonator unit 72, within upper n-type DBR layer 71.

Upper dielectric DBR layer 73 includes a plurality of pairs of $SiO_2$ layer 731 and amorphous Si layer 732. Optical resonator unit 72 comprises a laminate of ternary quantum well active layer (hereinafter simply referred to as the "active layer") 721, p-type AlGaAs electron block layer 722, tunnel junction 723, and n-type GaAs contact layer 724.

In this regard, since upper dielectric DBR layer 73 and optical resonator unit 72 are similar to components corresponding to the respective ones in Example 2, detailed descriptions thereon are omitted. Also, like Example 2, an electrode is disposed for connecting to part of n-type GaAs contact layer 724.

As described above, in this Example, low refraction index layers are formed of $Al_{0.98}Ga_{0.02}As$ layers, which are prone to oxidization, other than n-type $Al_{0.9}Ga_{0.1}As$ layer 713 which is closest to optical resonator unit 72 in lower n-type DBR layer 71. Then, this layer is oxidized to provide AlOx oxide low refraction index layer 712. The $Al_{0.98}Ga_{0.02}As$ layer is formed in such a thickness that causes the optical path length to be λ/4 after oxidization.

The number of pairs of GaAs layer 711 and $Al_{0.98}Ga_{0.02}As$ layer (corresponding to AlOx oxide low refraction index layer 712) was chosen to be five. Also, since no current flows through this portion, a layer corresponding to Si doped AlGaAs graded layer 514, provided in Example 2, is required only on both sides of n-type $Al_{0.9}Ga_{0.1}As$ layer 713.

A process of oxidizing the $Al_{0.98}Ga_{0.02}As$ layer is similar to that described in Example 3. In this Example, since no electrode is available from the GaAs substrate, a surface electrode is taken from part of high refraction index GaAs contact layer 715 closest to optical resonator unit 72.

Relaxation oscillation frequency fr of a device with a current confinement diameter of 5 μm of this VCSEL is approximately 30 GHz which is higher than those of the VCSEL structures in Examples 2, 3. Presumably, this is because the effective resonator length of the VCSEL in the growth direction in Example 4 is largely reduced to 0.43 μm, so that the current modulation efficiency at fr is increased to approximately 1.7 times as high as that of an oxide confined type VCSEL with an associated λ-cavity, allowing the upper limit of relaxation oscillation frequency fr to extend.

However, while fr should be mathematically extended up to approximately 34 GHz, the upper limit is not extended to that degree. Presumably, this is because the AlOx oxidized low refraction index layer 712, which is an insulating layer produced by oxidizing the semiconductor, is adjacent to the GaAs substrate, and this layer has a high heat resistivity, so that the active layer is rapidly heated when a driving current is increased, causing the extension of relaxation oscillation frequency fr for the current to correspondingly become saturated at an earlier stage.

Example 5

In this Example, p-type GaAs is employed for the substrate, and the lower DBR layer is comprised of a p-type doped layer.

Figure 9:
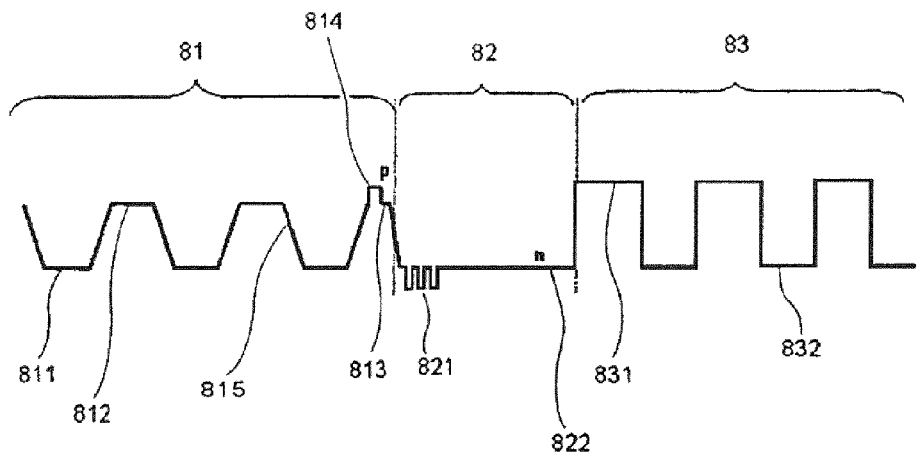
FIG. 9 is a schematic diagram showing a band structure of a surface emitting laser according to Example 5.

FIG. 9 is a schematic diagram showing a band structure of a surface emitting laser according to this Example. While FIG. 9 does not show the vertical axis or horizontal axis, the vertical axis and horizontal axis are similar to those in FIG. 2.

As shown in FIG. 9 the surface emitting laser of this Example comprises first multilayer Bragg reflecting mirror 81, second multilayer Bragg reflecting mirror 83, and optical resonator unit 82 sandwiched by these DBRs. First multilayer Bragg reflecting mirror 81 corresponds to a lower DBR layer, and second multilayer Bragg reflecting mirror 83 corresponds to an upper DBR layer.

Lower DBR layer 81 includes a plurality of pairs, each of which constitutes a basic unit and is a combination of p-type GaAs high refraction index layer 811 and p-type AlGaAs low refraction index layer 812. P-type AlGaAs graded layer 815 is disposed between the low refraction index layer and high refraction index layer to reduce electric resistance.

Part of p-type AlGaAs low refraction index layer 813 near optical resonator unit 82 serves as C doped $Al_{0.98}Ga_{0.02}As$ layer (oxide confinement layer) 814 which is a current confinement layer. Upper DBR layer 83 includes a plurality of pairs of $SiO_2$ layer 831 and amorphous Si layer 832. Optical resonator unit 82 comprises a laminate of ternary quantum well active layer 821 and n-type GaAs contact layer 822.

Since optical path length $n_{eff}L$ of optical resonator unit 82 and the placement of ternary quantum well active layer 821 are similar to those in Example 1, detailed descriptions thereon are omitted. Also, like Example 2, an electrode is disposed for connecting to part of n-type GaAs contact layer 822.

As described above, in this Example, C doped $Al_{0.98}Ga_{0.02}As$ layer 814 is disposed in part of p-type AlGaAs low refraction index layer 813 near optical resonator unit 82 for oxide confinement. N-type contact layer 822 made of Si doped GaAs is disposed in part of optical resonator unit 82. Upper DBR layer 83 is comprised of a dielectric DBR made up of three pairs of $SiO_2$ layer 831/amorphous Si layer 832.

In this regard, this Example differs from the other Examples described above in that a combination of two DBRs comprises a p-type semiconductor layer (corresponding to lower DBR layer 81) and a dielectric layer (corresponding to upper DBR layer 83), and the semiconductor layer is of p-type. The difference in the refraction index between optical resonator unit 82 and upper DBR layer 83 causes an anti-node of the electric field strength to be positioned on the boundary therebetween, and the position of the anti-node on the boundary does not change even if the optical path length of optical resonator unit 82 is extended by ΔL, as is done in Example 1. For this reason, when the optical path length is extended by ΔL, active layer 821 is placed at a anti-node closer to the boundary of lower DBR layer 81 with optical resonator unit 82.

Since a process of fabricating this VCSEL structure into a device is similar to that of an associated oxide confined type VCSEL, a detailed description thereon is omitted.

In this Example, a p-type electrode for use in operating the surface emitting laser was implemented by a p-type electrode made of titanium (Ti)/gold (Au) which are formed on the back of the substrate. The effective cavity length of the VCSEL in the growth direction in this Example was similar to those of Examples 2, 3, and relaxation oscillation frequency fr was 26 GHz which was also similar to those of Examples 2, 3.

Alternatively, the p-type electrode may be disposed in part of the p-type semiconductor layer in first multilayer Bragg reflecting mirror 81. Since a p-type substrate and p-type semiconductor layer exhibit high resistances, an electrode may be positioned closer to the active layer to apply a voltage, thus facilitating the injection of holes into the active layer.

Example 6

In this Example, the first multilayer Bragg reflecting mirror and second multilayer Bragg reflecting mirror described in Example 5 are both comprised of semiconductor DBRs.

Figure 10:
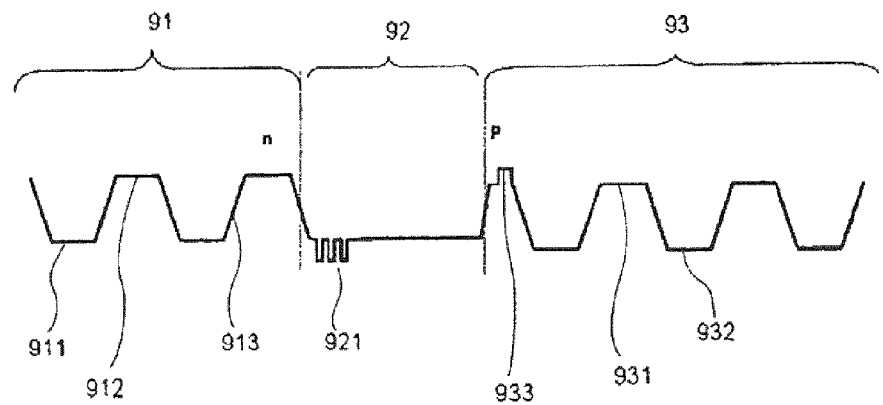
FIG. 10 is a schematic diagram showing a band structure of a surface emitting laser according to Example 6.

FIG. 10 is a schematic diagram showing a band structure of a surface emitting laser according to this Example. While FIG. 10 does not show the vertical axis or horizontal axis, the vertical axis and horizontal axis are similar to those in FIG. 2.

As shown in FIG. 10, the surface emitting laser of this Example comprises lower DBR layer 91, upper DBR layer 93, and optical resonator unit 92 sandwiched by these DBRs. Lower DBR layer 91 corresponds to a first multilayer Bragg reflecting mirror, and upper DBR layer 93 corresponds to a second multilayer Bragg reflecting mirror. Each of lower DBR layer 91 and upper DBR layer 93 is comprised of a semiconductor DBR.

Lower DBR layer 91 includes a plurality of pairs, each of which constitutes a basic unit, and is a combination of n-type GaAs high refraction index layer 911 and n-type AlGaAs low refraction index layer 912. N-type AlGaAs graded layer 913 is disposed between the low refraction index layer and high refraction index layer to reduce electric resistance. Optical resonator unit 92 is configured to include ternary quantum well active layer 921.

Upper DBR layer 93 includes a plurality of pairs of p-type AlGaAs low refraction index layer 931 and p-type GaAs high refraction index layer 932. Part of p-type AlGaAs low refraction index layer 933 near optical resonator unit 92 serves as p-type AlGaAs oxide confinement layer (current confinement layer) 933 which is a current confinement layer. P-type AlGaAs oxide confinement layer 933 is, for example, a C doped $Al_{0.98}Ga_{0.02}As$ layer.

As described above, in this Example, an n-type semiconductor DBR (corresponding to lower DBR layer 91) is formed on an n-type GaAs substrate, and optical resonator unit 92 and p-type semiconductor DBR (corresponding to upper DBR layer 93) are sequentially formed on the n-type semiconductor DBR. Current confinement layer 933 is situated in the low refraction index layer closest to optical resonator unit 92 of the p-type semiconductor DBR. An n-side electrode can be taken either from the surface or from the back.

In this Example, semiconductor DBRs are employed for lower DBR layer 91 and upper DBR layer 93 disposed on and below optical resonator unit 92. Accordingly, a optical penetration depth in this portion is as large as approximately 0.47 μm on one side, so that even if the optical path length of optical resonator unit 92 is reduced to approximately one-half, the overall effective resonator length is not so much reduced.

In this Example, the effective resonator length is approximately 1.15 μm. This is 0.93 times the effective cavity length of a VCSEL of a λ-cavity (approximately 1.242 μm), so that the current modulation efficiency at fr increases approximately 1.04 times, and the relaxation oscillation frequency fr is expected to be approximately 21 GHz.

While the oscillation wavelength of the surface emitting laser is shown to be 1070 nm by way of example in any one of Examples 1 through 6 described above, similar effects are expected in different wavelength bands using other material systems.

Also, while the selective oxidization of AlGaAs is employed in part of the current confinement structure, this may be replaced with a current confinement structure, to which ion implantation of ions such as protons is performed. Further, while the quantum well structure includes three wells, the number of wells is not so limited as long as a gain is obtained as required for oscillation.

Also, while the optical path length $n_{eff}L$ of the optical resonator has been described as $0.6\lambda$, optical path length $n_{eff}L$ may be in the range of $0.5\lambda < n_{eff}L \leq 0.7\lambda$. Also, while the VCSEL is formed on an n-type GaAs substrate, a p-type substrate may be used with the layers being laminated in the reverse order. Further, while Example 6 shows a p-type oxide current confinement structure as a current confinement structure, an n-type oxide current confinement structure may be employed, as shown in Example 3.

While the invention has been particularly shown and described with reference to exemplary embodiments and Examples thereof, the invention is not limited to these embodiments and Examples. It will be understood by those of ordinary skill in the art that various changes in form and details may be made therein without departing from the spirit and scope of the present invention as defined by the claims.

The invention claimed is:

1. A surface emitting laser comprising:
   a first multilayer Bragg reflecting mirror including a first layer and a first high refraction index layer having a refraction index larger than that of said first layer;
   a second multilayer Bragg reflecting mirror including a second layer and a second high refraction index layer having a refraction index larger than that of said second layer; and
   an optical resonator unit sandwiched by said first and second multilayer Bragg reflecting mirrors and including an active layer for generating an optical gain, wherein:
   with respect to said first multilayer Bragg reflecting mirror, said first layer is in contact with said optical resonator unit, and with respect to said second multilayer Bragg reflecting mirror, said second layer is in contact with said optical resonator unit,
   effective refraction index $n_{eff}$ of said resonator unit is larger than those of said first and second layers, and optical path length $n_{eff}L$ of said optical resonator unit is in a relationship of $0.5\lambda < n_{eff}L \leq 0.7\lambda$ with $\lambda$ which is oscillation wavelength of said surface emitting laser, and
   said active layer is situated at a position spaced away by a value of $\Delta L$ from a boundary between said optical resonator unit and said first multilayer Bragg reflecting mirror or said second multilayer Bragg reflecting mirror, where $\Delta L$ is a value resulting from subtraction of $0.5\lambda$ from said optical path length $n_{eff}L$.

2. The surface emitting laser according to claim 1, wherein:
   said first layer and said first high refraction index layer are semiconductor layers,
   said second layer and said second high refraction index layer are dielectric layers,
   a boundary between said second multilayer Bragg reflecting mirror and said optical resonator unit is situated at a site of a anti-node of an electric field strength, and
   said active layer is disposed at a position spaced away by the value of said $\Delta L$ from a boundary of said first multilayer Bragg reflecting mirror.

3. The surface emitting laser according to claim 2, wherein:
   said first layer and said first high refraction index layer have an n-type conductivity,
   said optical resonator unit is provided with a tunnel junction having a current confinement effect, being situated at a site of a node of said electric field strength, and a contact layer having said n-type conductivity is formed on said optical resonator unit, at a position closer to said second multilayer Bragg reflecting mirror than said tunnel junction, and
   an electrode is disposed on part of said contact layer.

4. The surface emitting laser according to claim 2, wherein:
   said first layer and said first high refraction index layer have an n-type conductivity,
   a current confinement structure is disposed in part of said first layer,
   said optical resonator unit is provided with a tunnel junction situated at a site of a node of said electric field strength, and a contact layer having said n-type conductivity is formed on said optical resonator unit, at a position closer to said second multilayer Bragg reflecting mirror than said tunnel junction, and
   an electrode is disposed on part of said contact layer.

5. The surface emitting laser according to claim 3, wherein part of said first multilayer Bragg reflecting mirror is comprised of a semiconductor and a layer formed of an oxidized semiconductor which is comprised of elements different from those of said semiconductor.

6. The surface emitting laser according to claim 2, wherein:
   said first layer and said first high refraction index layer have a p-type conductivity,
   a current confinement structure is disposed in part of said first layer,
   said optical resonator unit is formed with a contact layer having an n-type conductivity, being situated at a position closer to said second multilayer Bragg reflecting mirror than said active layer,
   a first electrode having the p-type conductivity is disposed in part of said first multilayer Bragg reflecting mirror, and
   a second electrode is disposed on said contact layer.

7. The surface emitting laser according to claim 1, wherein:
   said first layer and said first high refraction index layer are semiconductor layers having a first conductivity type,
   said second layer and said second high refraction index layer are semiconductor layers having a second conductivity type, and
   either one or both of said first multilayer Bragg reflecting mirror or said second multilayer Bragg reflecting mirror includes a current confinement structure.

8. The surface emitting laser according to claim 4, wherein part of said first multilayer Bragg reflecting mirror is comprised of a semiconductor and a layer formed of an oxidized semiconductor which is comprised of elements different from those of said semiconductor.

* * * * *